(12) United States Patent
Noguchi et al.

(10) Patent No.: US 7,557,411 B2
(45) Date of Patent: Jul. 7, 2009

(54) SEMI-CONDUCTOR-ON-INSULATOR STRUCTURE, SEMICONDUCTOR DEVICES USING THE SAME AND METHOD OF MANUFACTURING THE SAME

(75) Inventors: Takashi Noguchi, Seongnam-si (KR); Hans S. Cho, Seoul (KR); Wenxu Xianyu, Yongin-si (KR); Huaxiang Yin, Yongin-si (KR); Xiaoxin Zhang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 110 days.

(21) Appl. No.: 11/397,866

(22) Filed: Apr. 5, 2006

(65) Prior Publication Data

US 2006/0267017 A1   Nov. 30, 2006

(30) Foreign Application Priority Data

May 24, 2005   (KR) ...................... 10-2005-0043745

(51) Int. Cl.
*H01L 27/01* (2006.01)
*H01L 27/12* (2006.01)
*H01L 31/392* (2006.01)

(52) U.S. Cl. ...................... 257/347; 257/350

(58) Field of Classification Search ......... 257/347–354, 257/E27.112, E29.147
See application file for complete search history.

(56) References Cited

U.S. PATENT DOCUMENTS

| 6,800,518 | B2* | 10/2004 | Bendernagel et al. | 438/207 |
| 6,845,034 | B2* | 1/2005 | Bhattacharyya | 365/149 |
| 2004/0065884 | A1* | 4/2004 | Bhattacharyya | 257/347 |
| 2006/0234479 | A1* | 10/2006 | Liu et al. | 438/483 |

FOREIGN PATENT DOCUMENTS

JP   2004-342969   * 10/2004

* cited by examiner

*Primary Examiner*—Cuong Q Nguyen
(74) *Attorney, Agent, or Firm*—Harness, Dickey & Pierce, P.L.C.

(57) ABSTRACT

Semiconductor-on-insulator (SOI) structures, semiconductor devices using the same and methods of manufacturing the same, and more particularly, to a structure with a single-crystalline (for example, germanium (x-Ge)) layer on an insulating layer, semiconductor devices using the same, and methods of manufacturing the same. The SOI structure may include a single-crystalline substrate formed of a first semiconductor material, a first insulating layer formed on the substrate and having at least one window exposing a portion of the substrate, a first epitaxial growth region formed on a surface of the substrate exposed by the window and formed of at least one of the first semiconductor material and a second semiconductor material, and a first single-crystalline layer formed on the first insulating layer and the first epitaxial growth region and formed of the second semiconductor material, and crystallized using a surface of the first epitaxial growth region as a seed layer for crystallization.

16 Claims, 8 Drawing Sheets

SEMI-CONDUCTOR-ON-INSULATOR STRUCTURE, SEMICONDUCTOR DEVICES USING THE SAME AND METHOD OF MANUFACTURING THE SAME

PRIORITY STATEMENT

This application claims priority under 35 U.S.C. § 119 of Korean Patent Application No. 10-2005-0043745, filed on May 24, 2005, in the Korean Intellectual Property Office (KIPO), the entire contents of which are incorporated herein by reference.

BACKGROUND OF THE INVENTION

1. Field of the Invention

Example embodiments of the present invention relate to semiconductor-on-insulator (SOI) structures, semiconductor devices using the same and methods of manufacturing the same, and more particularly, to a structure with a single-crystalline (for example, germanium (x-Ge)) layer on an insulating layer, semiconductor devices using the same, and methods of manufacturing the same.

2. Description of the Related Art

A germanium-on-insulator structure may be a semiconductor-on-insulator (SOI) structure with an insulating layer between a semiconductor material layer and a main substrate. Additionally, the semiconductor material layer may be formed of germanium.

A transistor with a conventional silicon-on-insulator (SOI) structure may have excellent switching speed and may be less influenced by a signal noise due to cosmic ray particles. Moreover, because an insulating gap may be provided between adjacent transistors a chip may be more highly integrated by narrowing insulating gap between the transistors and/or preventing a latch up between same.

FIG. 1 is a cross-sectional view of a thin film transistor 20 with a conventional SOI structure. Referring to FIG. 1, an insulating layer 11 may be formed on a silicon, glass or plastic substrate 10. A silicon channel layer 12 may be formed on the insulating layer 11. A doped source region 12a and a doped drain region 12b may be formed on the silicon channel layer 12. A gate insulator layer 13 may be formed on the silicon channel layer 12, and a gate 14 may be formed on the gate insulator layer 13. An interlayer dielectric (ILD) 15 may be formed on the gate 14. Through-holes of the ILD 15 may be formed on the region corresponding to a source electrode 16 and a drain electrode 17. The source electrode 16 may be connected to the source 12a of the silicon channel 12 and the drain electrode 17 may be connected to the drain 12b of the silicon channel 12.

In a transistor with an SOI structure, the switching speed becomes faster as the mobility of the semiconductor layer is increased. The mobility may depend on the type and the crystal structure of materials used. The mobility of a polycrystalline structure is higher than that of an amorphous structure. Also the mobility of a single-crystalline structure is higher than that of the polycrystalline structure. Additionally, the mobility of Ge is higher than that of Si. When using single-crystalline germanium (x-Ge), a transistor may have excellent switching speed.

Moreover, compared with silicon, germanium may require a lower manufacturing temperature for crystallization and also may be compatible with a system-on-panel (SOP) structure including a complementary metal-oxide semiconductor (CMOS) of a three-dimensional structure or a plastic substrate. Because germanium may be prone to have a low quality of native oxide and/or a larger gate leakage, when implementing, it has not been widely used in a metal-oxide semiconductor field effect transistor (MOSFET). However, germanium may be used in a GOI structure with a high-k gate insulator.

Conventionally, a wafer bonding process may be used. According to a so-called SmartCut™ conventional manufacturing method of forming a GOI structure, this conventional method includes forming a silicon/germanium alloy buffer layer with concentration gradient on a bare wafer with a constant thickness, forming a boundary layer of hydrogen dopant by injecting hydrogen ions (H+) on the buffer layer, forming a germanium layer and an etch-stop layer on the buffer layer, and exposing the germanium layer by polishing/etching processes after separating the boundary layer and bonding a wafer on a separate substrate. Such a conventional process is complex, time consuming and costly.

SUMMARY

Example embodiments of the present invention provide semiconductor-on-insulator (SOI) structures, semiconductor devices using the same and methods of manufacturing the same, and more particularly, to a structure with a single-crystalline (for example, germanium (x-Ge)) layer on an insulating layer, semiconductor devices using the same, and methods of manufacturing the same.

According to example embodiments of the present invention, there is provided a Semiconductor-On-Insulator (SOI) structure including a single-crystalline substrate formed of a first semiconductor material, a first insulating layer formed on the substrate and having at least one window exposing a portion of the substrate, a first epitaxial growth region formed on a surface of the substrate exposed by the window and formed of at least one of the first semiconductor material and a second semiconductor material, and a first single-crystalline layer formed on the first insulating layer and the first epitaxial growth region and formed of the second semiconductor material, and crystallized using a surface of the first epitaxial growth region as a seed layer for crystallization.

According to an example embodiment, the single-crystalline silicon substrate may include a substrate with a single-crystalline silicon layer on a silicon wafer or a support substrate of glass or plastic.

According to an example embodiment, when there are two windows, a single-crystalline germanium layer may be formed using a surface of each epitaxial growth region as a seed layer, grain boundary may be formed on the region where the germanium layers meets, and the GOI structure may be provided with a single-crystalline germanium layer of more than two single-crystalline regions.

According to an example embodiment, the first epitaxial growth region is formed of a silicon/germanium alloy.

According to an example embodiment, the SOI structure may further include a buffer layer formed on the first single-crystalline germanium layer and formed of a silicon/germanium alloy and a single-crystalline strained silicon layer formed on a surface of the buffer layer and crystallized using a surface of the buffer layer as a seed layer for crystallization.

According to an example embodiment, the first semiconductor material is germanium and the second semiconductor material is germanium.

According to an example embodiment, a transistor may include a semiconductor channel using a portion of a first single-crystalline layer of an SOI structure, wherein the first semiconductor material is silicon and the second semiconductor material is germanium, a gate insulating layer formed on the semiconductor channel, and a gate formed on the gate insulating layer.

According to an example embodiment, a transistor may include a strained silicon channel using a portion of a single-crystalline strained silicon layer of an SOI structure, a gate insulating layer formed on the strained silicon channel, and a gate formed on the gate insulating layer.

According to an example embodiment, a transistor may include a germanium channel using a portion of a first single-crystalline layer of an SOI structure, a gate insulating layer formed on the germanium channel, and a gate formed on the gate insulating layer.

According to an example embodiment, a three-dimensional semiconductor device may include a transistor, wherein the gate insulating layer and the gate form a first semiconductor device part disposed on an active region of the first single-crystalline germanium layer, a second insulating layer covering a top surface of the first semiconductor device part, and having a second window exposing a portion of a passive region in the first single-crystalline germanium layer, a second epitaxial growth region formed on a surface of the first single-crystalline germanium layer exposed by the second window, a second single-crystalline germanium layer is formed on the second insulating layer and the second epitaxial growth region, and crystallized using a surface of the second epitaxial growth region as a seed layer for crystallization, and a second semiconductor device part formed on the second insulating layer and the second epitaxial growth region, and disposed on an active region of the second single-crystal germanium layer.

According to an example embodiment, a three-dimensional semiconductor device may include a second buffer layer formed on the second single-crystalline germanium layer and formed of a silicon/germanium alloy.

According to an example embodiment, a three-dimensional semiconductor device may include a transistor, wherein the gate insulating layer and the gate form a first semiconductor device part disposed on an active region of the first single-crystalline germanium layer, a second insulating layer covering a top surface of the first semiconductor device part, and having a second window exposing a portion of a passive region in the first single-crystalline germanium layer, a second epitaxial growth region formed on a surface of the first single-crystalline germanium layer exposed by the second window, a second single-crystalline germanium layer is formed on the second insulating layer and the second epitaxial growth region, and crystallized using a surface of the second epitaxial growth region as a seed layer for crystallization, and a second semiconductor device part formed on the second insulating layer and the second epitaxial growth region, and disposed on an active region of the second single-crystal germanium layer.

According to another example embodiment of the present invention, there is provided a method of manufacturing an SOI structure, including forming an insulating layer on a single-crystalline substrate of a first semiconductor material and a window exposing a portion of the single-crystalline substrate in the insulating layer, forming an epitaxial growth region by vapor-depositing at least one of a first semiconductor material and a second semiconductor material on a surface of the single-crystalline substrate exposed by the window, forming an objective layer for crystallization by depositing the second semiconductor material on the insulating layer and the epitaxial growth region, and crystallizing the second semiconductor material using a surface of the epitaxial growth region as a seed layer by thermally treating the objective layer for crystallization.

According to another example embodiment of the present invention, the first epitaxial growth region is formed of a silicon/germanium alloy.

According to another example embodiment of the present invention, the method includes forming a buffer layer on a single-crystalline germanium layer by vapor-depositing a silicon/germanium alloy and crystallizing silicon using a surface of the buffer layer as a seed layer for crystallization by depositing and thermally treating silicon on the buffer layer.

According to another example embodiment of the present invention, the first semiconductor material is germanium and the second semiconductor material is germanium.

According to example embodiments, the first and the second semiconductor material may be an element of group IV, an intermetallic compound of group III and group V, or a compound of group II and group VII. Accordingly, it is possible to select the combination of silicon (Si) and germanium (Ge), or sapphire ($Al_2O_3$) and silicon (Si) for epitaxial growth.

According to example embodiments, there is provided methods of manufacturing transistors and/or three-dimensional devices.

BRIEF DESCRIPTION OF THE DRAWINGS

The above and other features and advantages of example embodiments of the present invention will become more apparent by describing in detail example embodiments thereof with reference to the attached drawings in which.

DETAILED DESCRIPTION EXAMPLE EMBODIMENTS OF THE PRESENT INVENTION

A GOI structure, a semiconductor device using the same, and a method of manufacturing the GOI structure according to an example embodiment of the present invention will now be described in detail with reference to the accompanying drawings.

Figure 1:
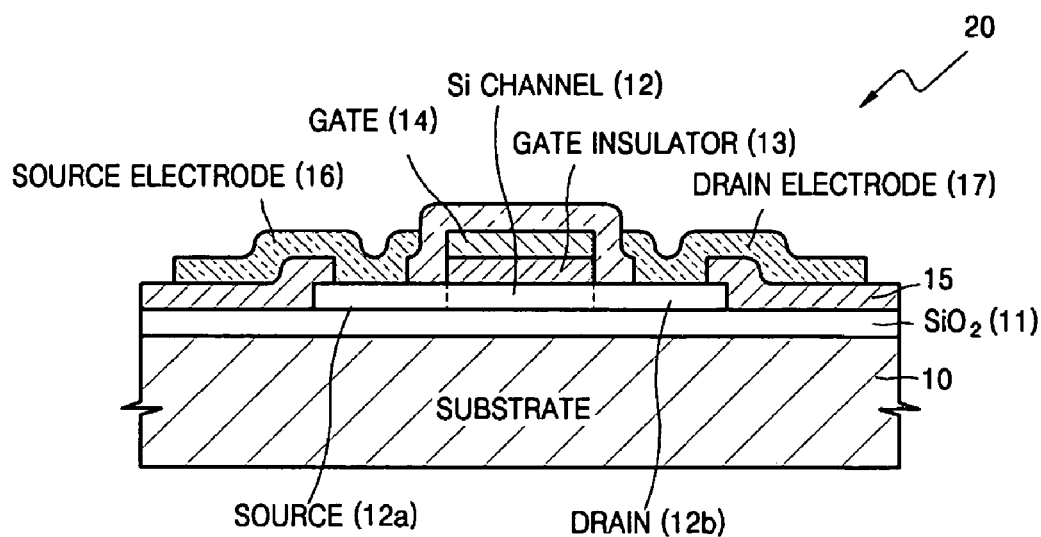
FIG. 1 is a sectional view of a thin film transistor with a conventional SOI structure.
Figure 2:
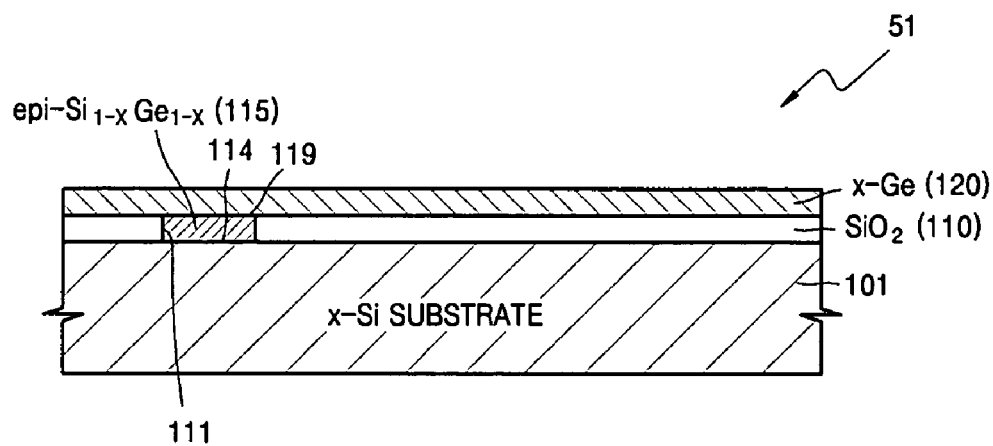
FIG. 2 is a sectional view of a GOI structure according to an example embodiment of the present invention.

FIG. 2 is a sectional view of a GOI structure according to an example embodiment of the present invention. The GOI structure 51 may include a single-crystalline silicon (x-Si)

substrate 101, an insulating layer 110 on the substrate, and/or a single-crystalline germanium (x-Ge) layer 120 on the insulating layer 110. A window 111 that acts as a through-hole exposing a portion of the substrate 101 may be formed in the insulating layer 110. An epitaxial growth region 115 may be grown perpendicularly by selective epitaxy from a surface of the single-crystalline silicon substrate and may be formed in the window 111.

The epitaxial growth region 115 may be formed of a silicon/germanium alloy (epi-Si1-xGex). In an example embodiment, an alloy ratio of germanium increases as a distance from a surface of the silicon substrate 101 increases. The epitaxial growth region 115 may be grown by using an exposed surface 114 of the substrate 101 as a seed layer for crystallization. Because the alloy ratio of the germanium increases, the germanium layer 120 may be formed by using a top surface 119 as a seed layer for crystallization.

Because mobility for electrons and holes of a single-crystalline germanium is greater than 500 cm2/Vs, the GOI structure 51 may be used for a thin film transistor acting as a high-speed switch and may be applied to a large scale integrated circuit. The GOI structure may provide improved properties. For example, because a band gap of the single-crystalline crystal germanium is low, the GOI structure may be advantageous for a low-voltage design and may be used in a light sensor (for example, an infrared sensor).

Figure 3:
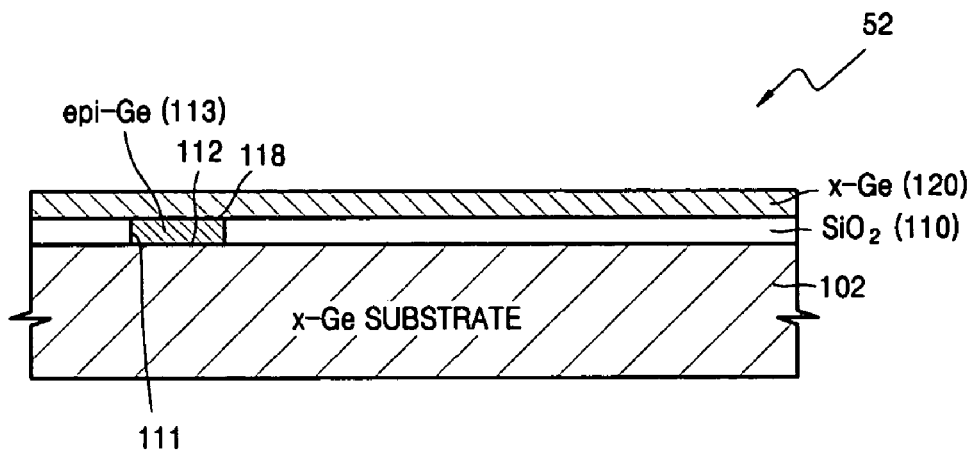
FIG. 3 is a sectional view of a GOI structure according to another example embodiment of the present invention.

FIG. 3 is a sectional view of a GOI structure according to another example embodiment of the present invention. The GOI structure 52 may include a single-crystalline germanium (x-Ge) substrate 102, an insulating layer 110, and a single-crystalline germanium layer 120. A window 111 that acts as a through-hole exposing a portion of the substrate 102 may be formed in the insulating layer 110. An epitaxial growth region 113 may be grown perpendicularly by selective epitaxy from a surface 112 of the single-crystalline germanium substrate 102 and may be formed in the window 111. In an example embodiment, the epitaxial growth region 113 may be formed of germanium (epi-Ge), and the single-crystalline germanium layer may be formed by using a top surface 118 as a seed layer for crystallization.

Figure 4:
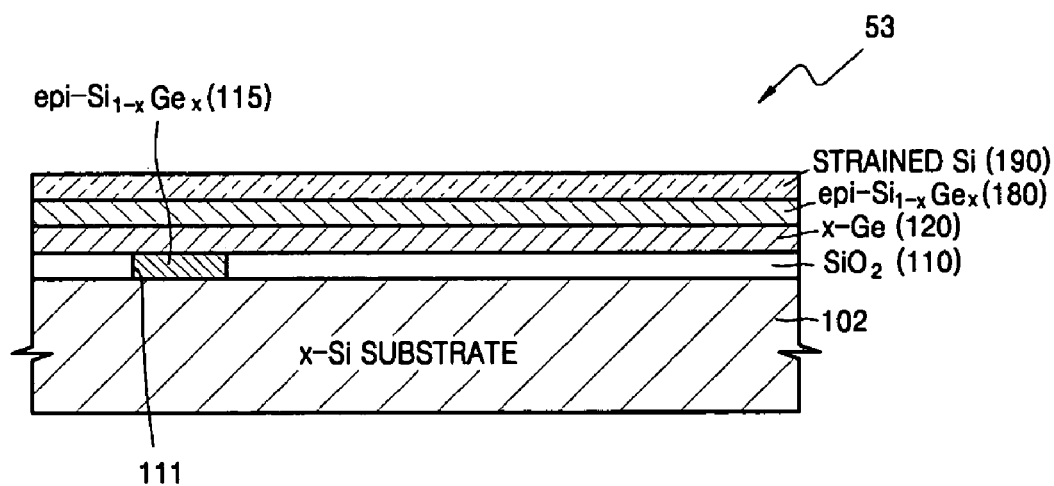
FIG. 4 is an example sectional view of a strained silicon layer on the GOI structure in FIG. 2.

FIG. 4 is a sectional view of a strained silicon layer formed on the GOI structure illustrated in FIG. 2 according to an example embodiment of the present invention. The single-crystalline strained silicon layer 190 may use a buffer layer (epi-Si$_{1-x}$Ge$_x$) 180 of a silicon/germanium alloy as a seed layer for crystallization and is formed on a single-crystalline germanium (x-Ge) layer 120.

The buffer layer 180 may have concentration gradient such that an alloy ratio of germanium gradually decreases as a distance from a surface of the single-crystalline germanium layer 120 increases. In an example embodiment sufficient tensile strain may be applied to a crystal structure of the single-crystalline silicon layer 190 by irregularly reducing a germanium density on a boundary surface between the buffer layer 180 and the single-crystalline strained silicon layer 190.

Figure 5:
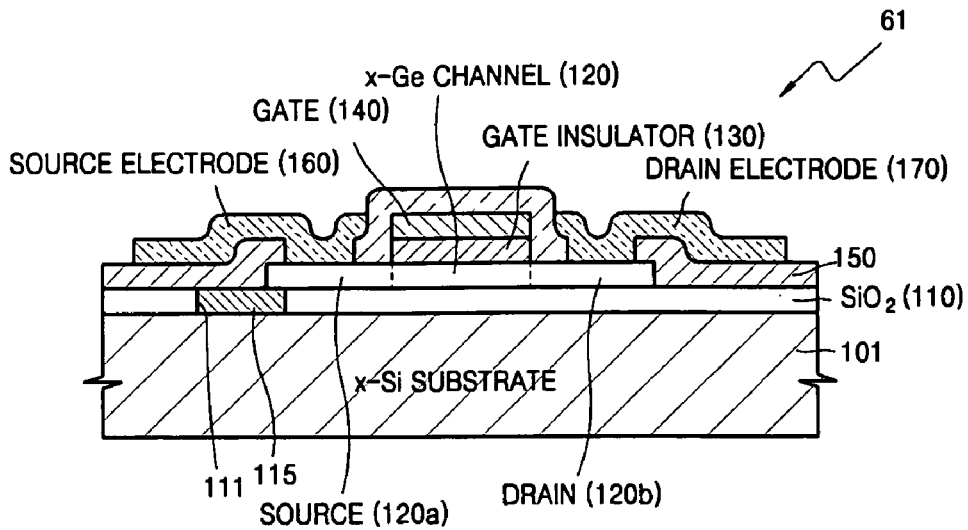
FIG. 5 is an example sectional view of a transistor with the GOI structure illustrated in FIG. 2.

FIG. 5 is a sectional view of a transistor with the GOI structure according to an example embodiment of the present invention. An insulating layer 110 may be formed on a single-crystalline silicon substrate 101, and a single-crystalline germanium channel layer 120 maybe formed on the insulating layer 110. A doped source region 120a and a doped drain region 120b may be formed on each side of the germanium channel 120. A gate insulating layer 130 may be formed on the channel 120, and a gate 140 may be formed on the gate insulating layer 130. An interlayer dielectric (ILD) layer 150 may be formed on the gate 140. Through-holes in the ILD 150 may be formed in the region corresponding to a source electrode 160 and a drain electrode 170. The source electrode 160 may be connected to the source 120a of the germanium channel 120, and the drain electrode 170 may be connected to the drain 120b of the germanium channel 120.

A transistor 61 with a GOI structure may further include a window 111 of the through-hole in the insulating layer 110, and an epitaxial growth region 115 of a silicon/germanium alloy in the window 111. The transistor 61 may use an exposed surface of the single-crystalline silicon substrate 101 and a top surface of the epitaxial growth region 115 as a first seed layer and a second seed layer for crystallization, respectively. The transistor 61 may have a structure for lateral crystallization of the germanium layer 120 on which the source, the drain, and/or the channel are formed.

The gate insulating layer 130 may be selected from the group consisting of hafnium oxide (HfO$_2$), zirconia (ZrO$_2$), and silicon oxide (SiO$_2$), and also may have a multilayer formed of more than two of the above materials.

Figure 6:
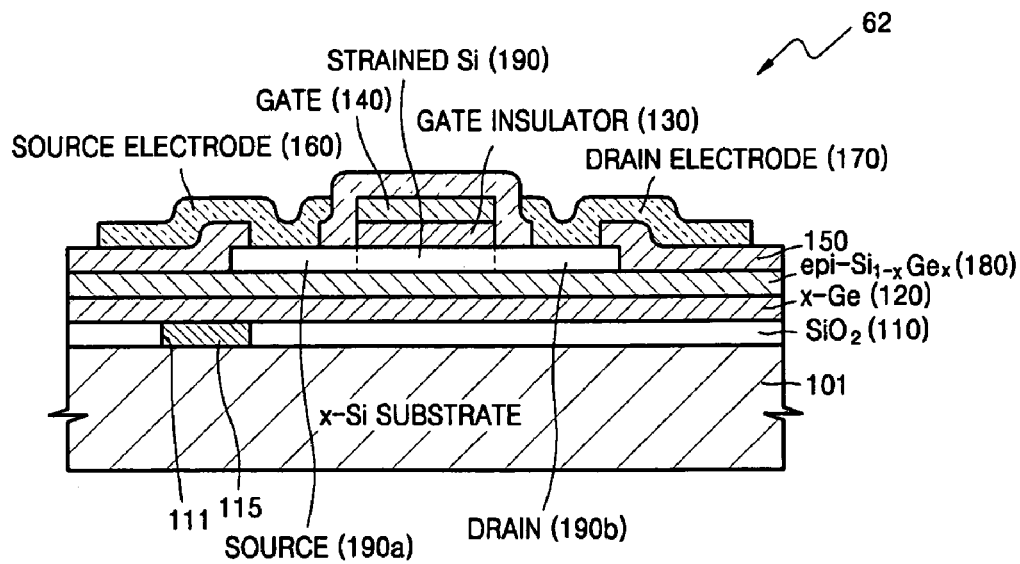
FIG. 6 is an example sectional view of a transistor with the GOI structure illustrated in FIG. 4.

FIG. 6 is a sectional view of a transistor 62 with the GOI structure illustrated in FIG. 4. The transistor 62 may use the GOI structure illustrated in FIG. 4 in which the buffer layer 180 and the strained silicon layer 190 are on the single-crystalline germanium layer 120. The transistor 62 may include a silicon channel, a source 190a, and/or a drain 190b. The epitaxial growth region 115 may be equivalent to that illustrated in FIG. 4. The gate 140 and the gate insulating layer 130 except the channel, the source, and the drain may be equivalent to the example transistor 61 illustrated in FIG. 5. The thin film transistors 61 and 62 illustrated in FIGS. 5 and 6 are a MOSFET. The transistors 61, 62 may be a PMOSFET or an NMOSFET according to a doping type of the single-crystalline germanium layer or the strained silicon layer. Additionally, a complementary metal-oxide semiconductor (CMOS) device can be formed using the PMOSFET and the NMOSFET. Also, it is possible to implement a semiconductor device with the GOI structure such as a capacitor of a passive element, an integrated circuit (IC) of a logic circuit, etc. Moreover, the GOI structure may be advantageous for a light sensor (for example, an infrared sensor) because a band gap of single-crystalline germanium is relatively low.

Figure 7:
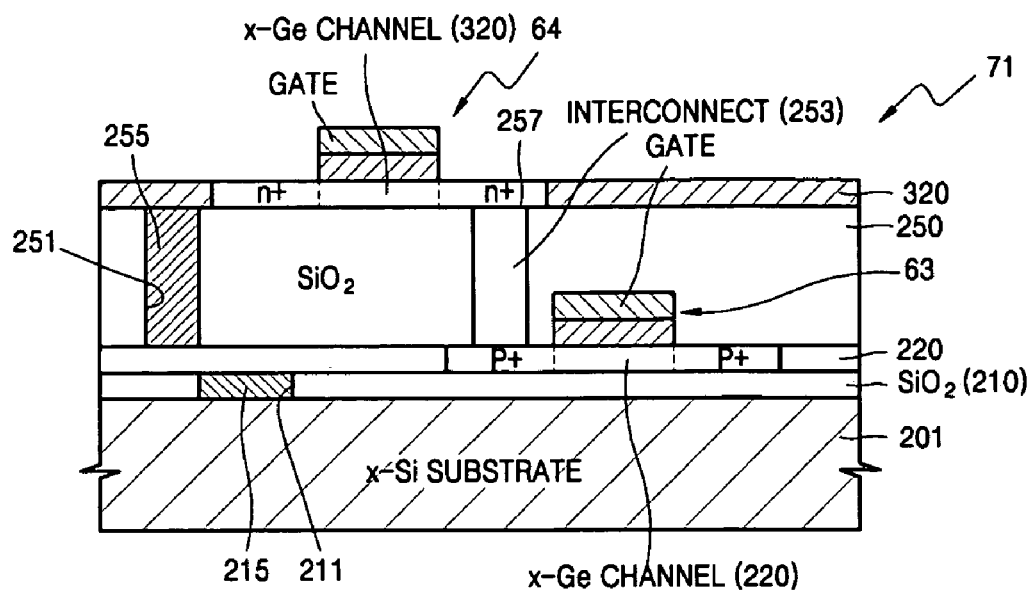
FIG. 7 is a sectional view of a three-dimensional semiconductor device with a GOI structure according to an example embodiment of the present invention.

FIG. 7 is a sectional view illustrating a three-dimensional semiconductor device with a GOI structure according to an example embodiment of the present invention. MOSFETs of a CMOS device may be formed on each single-crystalline germanium layer in a double-stacked GOI structure.

The three-dimensional semiconductor device 71 may include a single-crystalline silicon (x-Si) substrate 201, a first insulating layer 210 on the substrate 201, a single-crystalline germanium (x-Ge) layer 220 on the first insulating layer 210, and a first semiconductor device part 63 on the germanium layer 220. A first window that is a through-hole exposing a portion of the substrate 201 may be formed in the first insulating layer 210. An epitaxial growth region 215 may be grown perpendicularly by selective epitaxy from a surface of the single-crystalline silicon substrate 201 and may be formed in the window 211. The first epitaxial growth region 215 may be a silicon/germanium alloy and an example alloy ratio and example concentration gradient has been described above with reference to FIG. 2.

A second insulating layer 250 may be formed on the first single-crystalline germanium layer 220 and the first semiconductor device part 63, and a second single-crystalline germanium layer 320 may be formed on a plain top surface of the second insulating layer 250. A second window 251 exposing a portion of a passive region in the first single-crystalline germanium layer 220 may be formed in the second insulating layer 250. A second epitaxial growth region 255 may be grown perpendicularly by selective epitaxy from a surface of the first single-crystalline germanium layer 220 and formed in the second window 251. Additionally, the second epitaxial growth region 255 may be formed of pure germanium. The second single-crystalline germanium layer 320 may use a top surface of the second epitaxial growth region 255 as a seed layer for crystallization, and a second semiconductor device part 64 may be formed in an active region. Various semiconductor devices may be formed on the place of the first and the second semiconductor device part 63 and 64. According to an example embodiment 71 of the present invention, a PMOSFET and an NMOSFET may be formed at the place of the device part 63 and 64, respectively. An interconnect gate 253 may be formed in the second insulating layer 250. One end of the interconnect gate 253 may be electrically connected with the first semiconductor device part 63, and also another end of the interconnect part 253 may be electrically connected with the second semiconductor device part 64 or another circuit structure (not shown). The interconnect gate 253 may be filled with a conductive material, for example, a metal material or a semiconductor material with a dopant. In an example embodiment, the three-dimensional device 71 is a CMOS device, and source/drain of the PMOSFET 63 is connected with source/drain of the NMOSFET 64 by the interconnect gate 253.

Three-dimensional semiconductor devices such as the one illustrated in FIG. 7 are widely used. Moreover, while maintaining characteristics, for example, faster switching speed and/or a simpler design of a low-voltage driving circuit, chip size may be reduced using a multi-layered circuit. Additionally, a light sensor using single-crystalline germanium may be disposed on a top layer of the three-dimensional semiconductor device, and a circuit for processing a signal may be disposed on a bottom layer.

A three-dimensional semiconductor device may be provided with a multi-layer having an insulating layer between semiconductor device layers with a GOI structure in FIG. 2, a multi-layer having an insulating layer between semiconductor device layers with a GOI structure in FIG. 4, and/or a multi-layer having an insulating layer between a former semiconductor device layer and a latter semiconductor device layer.

A manufacturing method of a GOI structure will now be described in more detail. FIGS. 8A through 8D are sectional views illustrating a manufacturing process of a GOI structure according to an example embodiment of the present invention.

Figure 8A:
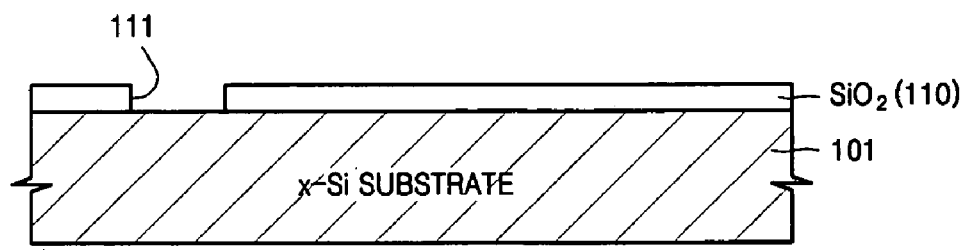
FIGS. 8A through 8D are sectional views illustrating a manufacturing process of the GOI structure according to an example embodiment of the present invention.

Referring to FIG. 8A, an insulating layer 110 may be formed on a single-crystalline silicon substrate 101, and a window 111 of a through-hole exposing a portion of the substrate 101 may be formed in the insulating layer 110. The single-crystalline silicon substrate 101 may be a silicon wafer, and can be a substrate with a single-crystalline silicon (x-Si) layer on a support substrate of glass or plastic. Single-crystalline silicon may be exposed through the window 111. For example, the insulating layer 110 can be formed by depositing silicon oxide ($SiO_2$). Moreover, conventional insulation materials may include oxides, nitrides, etc., and various methods may be used to form the insulating layer 110.

Figure 8B:
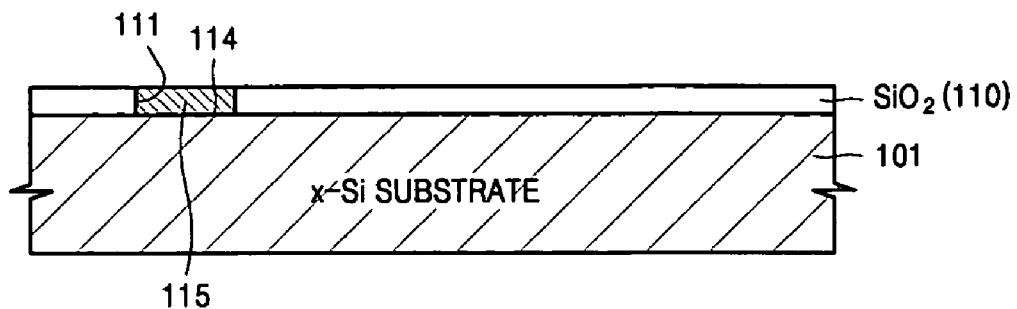

Referring to FIG. 8B, an epitaxial growth region 115 may be formed on an exposed surface 114 of the substrate 101 in the window 111 by chemical-depositing a silicon/germanium alloy. Crystal growth of the epitaxial growth region 115 may be formed by selective epitaxy. Silicon/germanium alloy crystals may grow perpendicularly from a silicon source and a germanium source using a surface of the single-crystalline silicon substrate 101 as a seed layer for crystallization. For example, an ultra high vacuum-chemical vapor deposition (UHV-CVD) method or a low pressure CVD (PL-CVD) method may be used to form the epitaxial growth region 114. When crystal growth of the epitaxial growth region 115 is in progress, an alloy ratio of germanium may be gradually increased by enhancing a partial pressure of a germanium source. By doing this, a form of a crystal lattice may be maintained, and distance between the lattices may be changed.

Figure 8C:
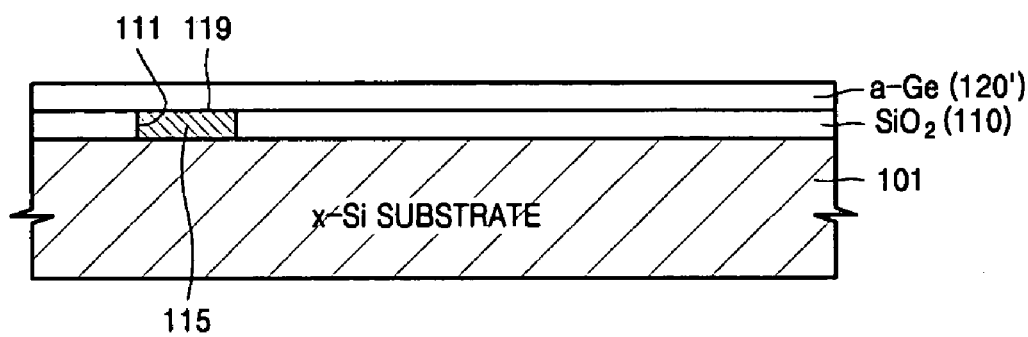
Figure 8D:
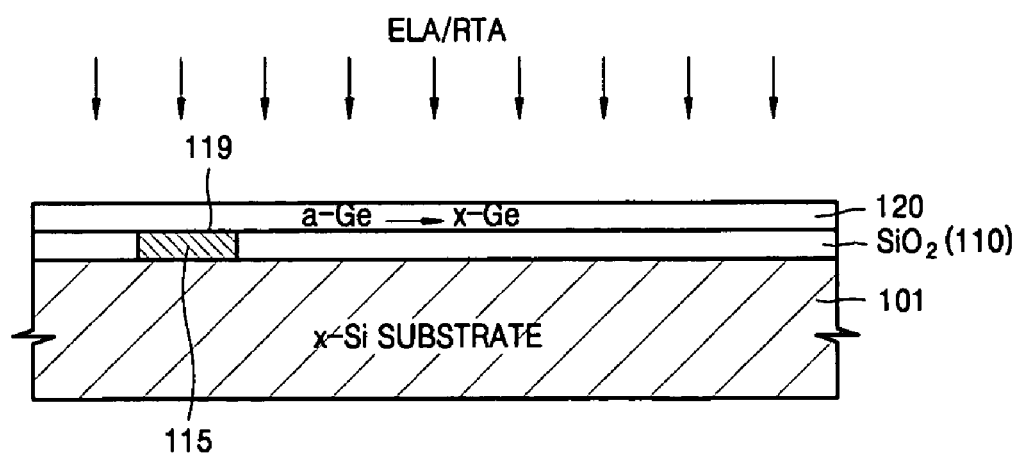

Referring to FIG. 8C, an objective layer 120' for crystallization may be formed by depositing germanium on the insulating layer 110 and the epitaxial growth region 115. The objective layer 120' may be amorphous germanium (a-Ge), polycrystalline germanium (p-Ge), or mixed germanium (mixed-Ge). The polycrystalline germanium may be formed differently according to various known deposition methods.

Referring to FIG, 8D, when using a surface 119 of the epitaxial growth region 115 as a seed layer, germanium may be crystallized by annealing the objective layer 120' for melting and cooling. An excimer laser may be used as a heat source. After melting the objective layer 120' by Excimer Laser Annealing (ELA), a germanium layer may be crystallized by cooling. Because only a surface of the GOI structure can be heated to a high temperature when using the ELA, thermal shock for a bottom structure and spread of unnecessary materials during a thermal treatment may be reduced.

A Rapid Thermal Annealing (RTA) method may be used as an annealing method. In an RTA method, a high temperature may be reached in a short time using a halogen lamp as a heat source. Although an RTA method may be more influential to a bottom structure than ELA method, it is possible to be used for manufacturing a GOI structure because a melting temperature (about 958° C.) of germanium is lower than a melting temperature (about 1415° C.) of silicon.

The crystallization of the objective layer 120' may grow in a lateral direction parallel to a surface of the epitaxial growth region 115 when melting germanium cools down. In an example embodiment, each epitaxial growth region 115 may be formed separated by a desired distance because polycrystallization may be formed by numerous nucleations of germanium when lateral crystallization can not be effective far from the epitaxial growth region 115. Consequently, when crystallization is processed in a plurality of epitaxial growth regions 115, a boundary may be formed at a region where each single-crystalline meets.

A conventional method can be used for manufacturing a semiconductor device with the GOI structure. A manufacturing method for a three-dimensional CMOS device will now be described briefly. FIGS. 9A through 9F are manufacturing processes of a three-dimensional semiconductor structure.

Figure 9A:
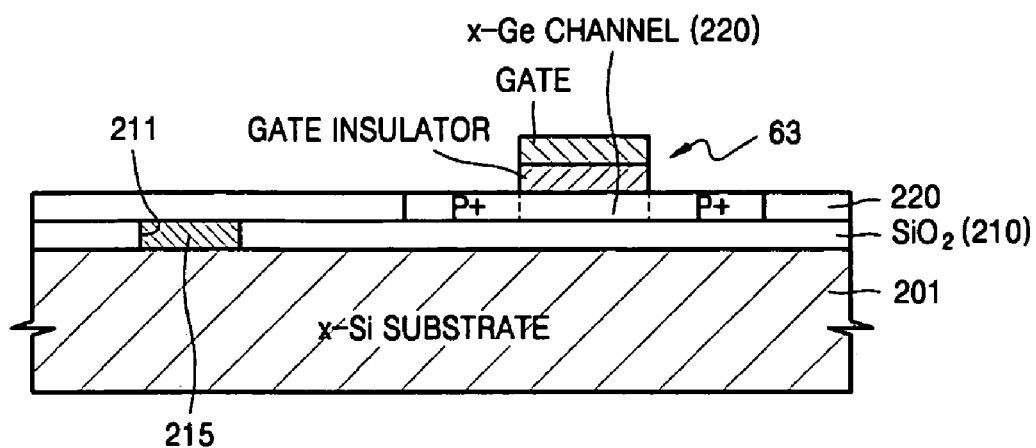
FIGS. 9A through 9F are sectional views illustrating a manufacturing process of a three-dimensional semiconductor device according to an example embodiment of the present invention.

Referring to FIG. 9A, a first semiconductor device part 63 may be formed on a single-crystalline germanium layer 220 in the GOI structure. For example, a PMOSFET may be formed with a gate insulating layer, a gate, a source, and a drain. The source and the drain may be formed by doping the single-crystalline germanium layer 220.

Figure 9B:
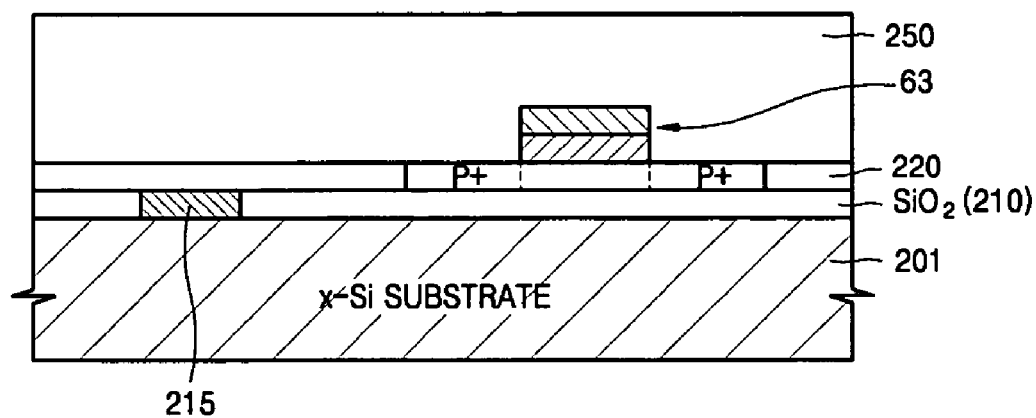
Figure 9C:
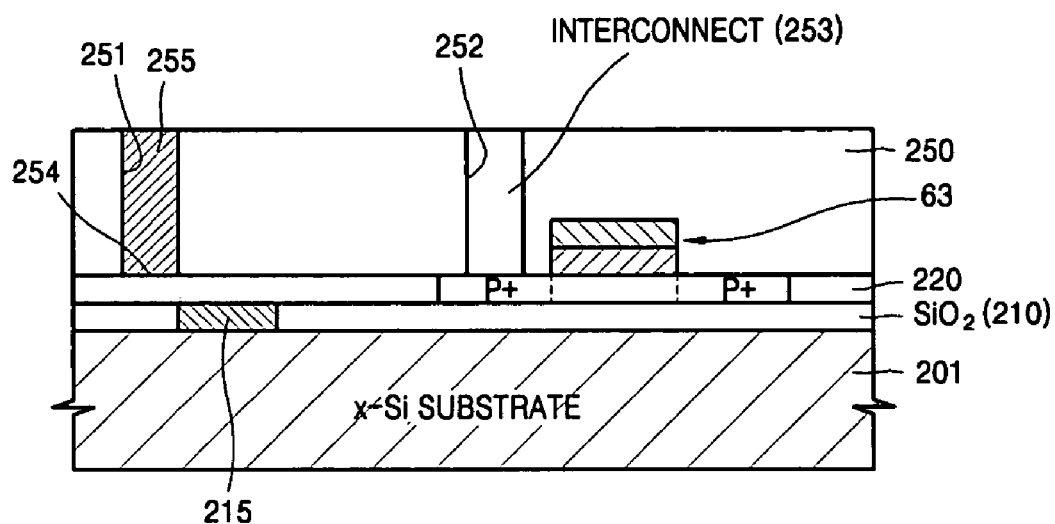

After a second insulating layer 250 is formed on the first semiconductor device part 63 in FIG. 9B, a second window 251 may be formed in a desired region of the second insulating layer 250 in FIG. 9C. An epitaxial growth region 215 may be formed perpendicularly growing germanium crystal (epi- Ge) by selective epitaxy, and using a surface 254 of the first single-crystalline germanium layer 220 as a seed layer for crystallization. An interconnect part 252 of another through-hole may be formed in the second insulating layer 20 and a bottom of the interconnect part 252 may contact a desired portion of the first semiconductor device part 63. The interconnect part 252 may provide electrical connection between layers by being filled with conductive material.

Figure 9D:
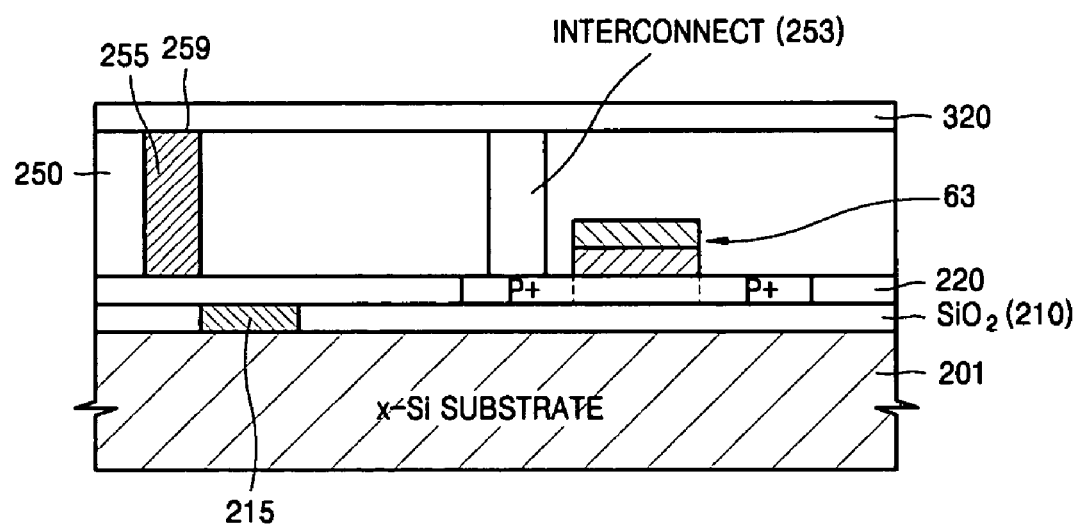
Figure 9E:
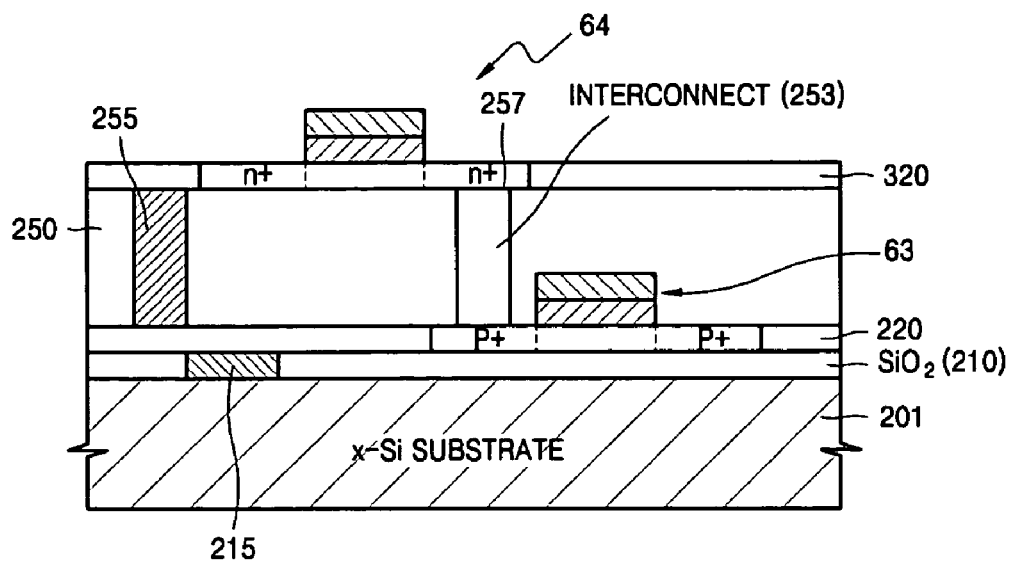
Figure 9F:
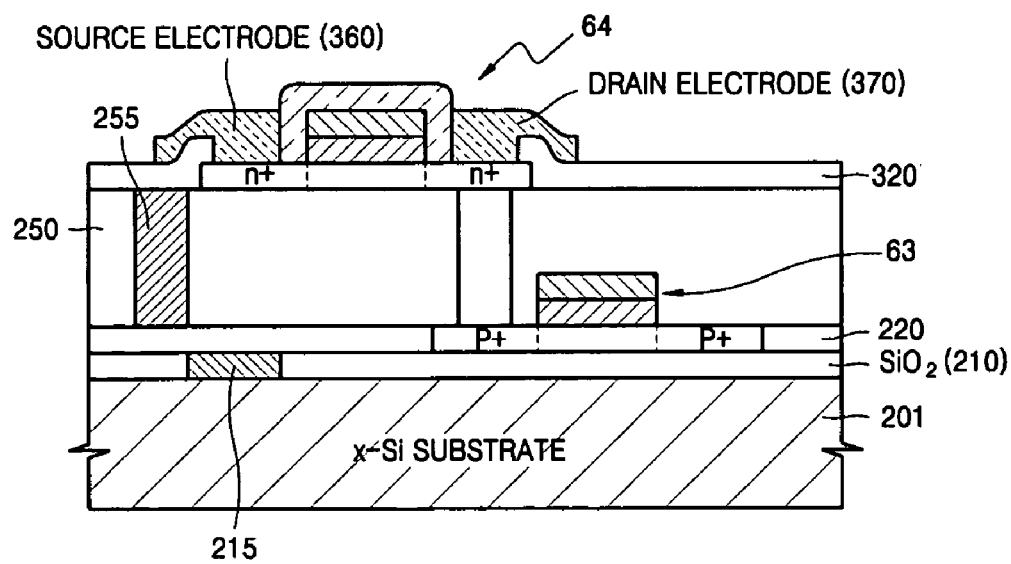

Referring to FIG. 9D, a second single-crystalline germanium layer 320 may be formed. After forming an amorphous or a polycrystalline germanium layer, lateral crystallization may be formed from a surface 259 of the second epitaxial growth region 255 by melting and cooling using ELA or RTA. Referring to FIG. 9E, a second semiconductor device part 64 may be formed on the second single-crystalline germanium layer 320. For example, when an NMOSFET is formed on a place of the second semiconductor device part 64, a CMOS device may be formed connecting the NMOSFET in the device part 64 with a PMOSFET in the device part 63 by the interconnect part 253. Referring to FIG. 9F, an interlayer dielectric (ILD) and source/drain electrode 360 and 370 may be formed.

A germanium-on-insulator (GOI) structure, a manufacturing method of the same, and a semiconductor device using the same are provided according to example embodiments of the present invention. The GOI structure may have a single-crystalline germanium layer and may be manufactured by relatively simple processes.

Additionally, highly-integrated semiconductor devices, for example, three-dimensional semiconductor devices, may be provided using characteristics of a single-crystalline germanium and advantages of a GOI structure.

It is noted that the various example embodiments set forth above may be implemented with materials, other than those set forth above. It is also noted that the features of various example embodiments of SOI structures, GOI structures, transistors, three-dimensional structures, methods of manufacturing SOI structures, GOI structures, transistors, and three-dimensional structures are interchangeable and may be implemented in any combination.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A Semiconductor-On-Insulator (SOI) structure comprising:
   a single-crystalline substrate formed of a first semiconductor material, the first semiconductor material being silicon;
   a first insulating layer formed on the substrate and having at least one window exposing a portion of the substrate;
   a first epitaxial growth region formed on a surface of the substrate exposed by the window, wherein the first epitaxial growth region is formed of a silicon/germanium alloy formed of the first semiconductor material and a second semiconductor material, the second semiconductor material being germanium; and
   a first single-crystalline layer formed on the first insulating layer and the first epitaxial growth region and formed of the second semiconductor material, and crystallized using a surface of the first epitaxial growth region as a seed layer for crystallization.

2. The SOI structure of claim 1, wherein an alloy ratio of germanium in the first epitaxial growth region gradually increases as a distance from the substrate increases.

3. The SOI structure of claim 1, further comprising:
   a buffer layer formed on the first single-crystalline germanium layer and formed of a silicon/germanium alloy; and
   a single-crystalline strained silicon layer formed on a surface of the buffer layer and crystallized using a surface of the buffer layer as a seed layer for crystallization.

4. The SOI structure of claim 3, wherein an alloy ratio of germanium in the first epitaxial growth region gradually increases as a distance from the substrate increases, and an alloy ratio of germanium in the buffer layer gradually decreases as a distance from the first single-crystalline germanium layer increases.

5. A transistor comprising:
   a semiconductor channel using a portion of the first single-crystalline layer of the SOI structure of claim 1;
   a gate insulating layer formed on the semiconductor channel; and
   a gate formed on the gate insulating layer.

6. The transistor of claim 5, further including a source and a drain on each side of the semiconductor channel.

7. The transistor of claim 5, wherein the gate insulating layer is selected form the group consisting of hafnium oxide ($HfO_2$), zirconia ($ZrO_2$), and silicon oxide ($SiO_2$).

8. A transistor comprising;
   a strained silicon channel using a portion of the single-crystalline strained silicon layer of the SOI structure of claim 3;
   a gate insulating layer formed on the strained silicon channel; and
   a gate formed on the gate insulating layer.

9. The transistor of claim 8, further including a source and a drain on each side of the strained silicon channel.

10. A three-dimensional semiconductor device comprising:
    the transistor of claim 5, wherein the gate insulating layer and the gate form a first semiconductor device part disposed on an active region of the first single-crystalline germanium layer;
    a second insulating layer covering a top surface of the first semiconductor device part, and having a second window exposing a portion of a passive region in the first single-crystalline germanium layer;
    a second epitaxial growth region formed on a surface of the first single-crystalline germanium layer exposed by the second window;
    a second single-crystalline germanium layer is formed on the second insulating layer and the second epitaxial growth region, and crystallized using a surface of the second epitaxial growth region as a seed layer for crystallization; and
    a second semiconductor device part formed on the second insulating layer and the second epitaxial growth region, and disposed on an active region of the second single-crystal germanium layer.

11. The three-dimensional semiconductor device of claim 10, wherein an alloy ratio of germanium in the second epitaxial growth region gradually increases as a distance from a exposed surface of the first strained silicon layer increases.

12. The three-dimensional semiconductor device of claim 10, wherein the first semiconductor device part is electrically connected to the second semiconductor device part or another circuit structure via an interconnect part passing through the second insulating layer.

13. The three-dimensional semiconductor device of claim 10, wherein the first and the second semiconductor device part are a first and a second transistor with a source, a drain, a germanium channel, and a gate corresponding to the germanium channel, respectively.

14. The three-dimensional semiconductor device of claim 13, wherein the first transistor is a PFET (P-type Field Effect Transistor), and the second transistor is an NFET (N-type Field Effect Transistor).

15. The three-dimensional semiconductor device of claim 10, further comprising:
a second buffer layer formed on the second single-crystalline germanium layer and formed of a silicon/germanium alloy.

16. The three-dimensional semiconductor device of claim 15, wherein an alloy ratio of germanium in the second buffer layer gradually decreases as a distance from a surface of the second single-crystalline germanium layer increases.

\* \* \* \* \*